(12) United States Patent
Carinci et al.

(10) Patent No.: US 11,029,382 B2
(45) Date of Patent: Jun. 8, 2021

(54) ECHO SHARING IN IMAGING SEQUENCES WITH MULTIPLE DELAYS AND MULTIPLE SPIN ECHOES

(71) Applicant: Siemens Healthcare GmbH, Erlangen (DE)

(72) Inventors: Flavio Carinci, Wuerenlingen (CH); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/750,118

(22) Filed: Jan. 23, 2020

(65) Prior Publication Data
US 2020/0233052 A1    Jul. 23, 2020

(30) Foreign Application Priority Data
Jan. 23, 2019    (EP) .................................... 19153204

(51) Int. Cl.
*G01R 33/561*    (2006.01)
*G01R 33/56*    (2006.01)

(52) U.S. Cl.
CPC ..... *G01R 33/5615* (2013.01); *G01R 33/5608* (2013.01)

(58) Field of Classification Search
CPC ........................ G01R 33/5615; G01R 33/5608
See application file for complete search history.

(56) References Cited

U.S. PATENT DOCUMENTS

| 5,570,019 A | * | 10/1996 | Moonen | G01R 33/4833 |
| | | | | 324/307 |
| 9,664,758 B2 | * | 5/2017 | Stemmer | G01R 33/4818 |
| 2013/0221963 A1 | * | 8/2013 | Serra | G01R 33/56 |
| | | | | 324/309 |
| 2017/0131373 A1 | | 5/2017 | Takeshima et al. | |
| 2017/0199258 A1 | | 7/2017 | Beck et al. | |

(Continued)

FOREIGN PATENT DOCUMENTS

WO    2018095851 A1    5/2018

OTHER PUBLICATIONS

Julien Senegas et al: "Fast T2 relaxometry with an accelerated multi-echo spin-echo sequence", NMR in Biomedicine., vol. 23, No. 8, May 31, 2010 (May 31, 2010), pp. 958-967, XP055600764; GB ISSN: 0952-3480, DOI: 10.1002/nbm.1521; 2010.

(Continued)

*Primary Examiner* — G. M. A Hyder
(74) *Attorney, Agent, or Firm* — Schiff Hardin LLP

(57) ABSTRACT

Techniques are described for generating an MR image of an object using a multi spin-echo based imaging sequence with a plurality of k space segments using a preparation pulse. The technique included acquiring a first k-space dataset of the object using a first echo time and a first delay after the preparation pulse before the several spin-echoes are acquired. The technique further includes acquiring a second k space dataset of the object using a second echo time and a second delay after the preparation pulse, with at least one of the second echo time and the second delay time being different from the corresponding first echo time and the first delay time, generating a combined k space, and generating the MR image based on the combined k space dataset.

11 Claims, 7 Drawing Sheets

(56) References Cited

U.S. PATENT DOCUMENTS

2020/0025849 A1* 1/2020 Paul ................. G01R 33/36
2020/0025850 A1* 1/2020 Zeller ............... G01R 33/286

OTHER PUBLICATIONS

Suchandrima Banerjee et al: "Single acquisition multiple contrast spine MRI using accelerated quantitative mapping" Proceedings of the International Society for Magnetic Resonance in Medicine, ISMRM, 24th Annual Meeting and Exhibition, Singapore, May 7-May 13, 2016, No. 4393, Apr. 22, 2016 (Apr. 22, 2016); XP040685432,; 2016.

European Search Report dated Jul. 10, 2019, for Application No. 19153204.3.

\* cited by examiner

ECHO SHARING IN IMAGING SEQUENCES WITH MULTIPLE DELAYS AND MULTIPLE SPIN ECHOES

CROSS-REFERENCE TO RELATED APPLICATIONS

The present application claims the benefit of the filing date of European patent application no. 19153204.3, filed on Jan. 23, 2019, the contents of which are incorporated herein by reference in their entirety.

TECHNICAL FIELD

The present disclosure relates to a method for generating an MR image of an object using a multi-spin-echo based imaging sequence. Furthermore a corresponding MR imaging system is provided, a computer program comprising program code, and a carrier comprising the computer program.

BACKGROUND

In order to generate synthetic contrast images, a multi-repetition sequence with multiple delay times can be used. Based on this information, the relaxation times are calculated on a per-pixel basis and used later for generating synthetic contrasts. In this context, several repetitions of fast spin-echo based sequence are performed with different echo times and different delay times after a preparation pulse. With the use of the several echo times and several delay times and the full k-space acquisitions, the data acquisition is quite long and, even with an acceleration factor of parallel imaging of three, a scan time that is typically in the range of five minutes is needed.

SUMMARY

Accordingly, a need exists to avoid the above-mentioned problems and to reduce the scan time needed for generating MR images in a situation with multiple echo times and multiple delay times. This need is met by the features of the independent claims and the various aspects as described herein. Further advantages are also disclosed in the aspects as described in the dependent claims and elsewhere herein.

According to a first aspect, a method for generating an MR image of an object is provided using a multi-spin-echo based imaging sequence in which, after an excitation RF pulse, several spin echoes are acquired in a plurality of k-space segments, wherein a preparation pulse is used before acquiring the several spin echoes. According to one step, a first k-space data set of the object is acquired using a first echo time and a first delay after the preparation pulse before the several spin echoes are acquired. The first k-space data set comprises a first segment located closer to a k-space center then a second segment, wherein a density of acquired k-space data lines is smaller in the second segment than in the first segment. Furthermore, a second k-space data set is acquired using a second echo time and a second delay after the preparation pulse, wherein at least one of the second echo time and the second delay time is different from the corresponding first echo time and the first delay time. The second k-space data set comprises a first segment located closer to a k-space center then a second segment, and a density of acquired k-space data lines is smaller in the second segment than in the first segment. The acquired k-space data lines in the second segment of the second k-space data set substantially differ from the acquired k-space data lines of the second segment of the first k-space data set. Furthermore, a combined k-space data set comprising a combined second segment is generated in which k-space data lines of the second segment of the first k-space data set and k-space data lines of the second segment of the second k-space data set are combined. Additionally, the MR image is generated based on the combined k space data set.

As the density of acquired k-space data lines in the second segment located further away from the k-space center is smaller, the acquisition time can be reduced. With the echo sharing approach as mentioned above using the combined second segment, which uses k-space data lines from the first k-space data set and the second k-space data set, the non-acquired data lines can be used from other acquisitions to obtain a fully sampled k-space. As the outer parts of k-space do not contribute to the contrast, but to the image resolution properties, the echoes from the outer segments can be shared between the different delay or echo times. This can help to save time for the data acquisition.

The combined k-space data set can comprise at least the first segment from the first or second k-space data set and the combined second segment. Accordingly, the combined k-space comprises the inner parts of the k-space from one acquisition, wherein the outer parts can comprise a combination of signals from different acquisitions with different delay or echo times.

The density of the combined k-space status is preferably homogeneous and constant over the combined k-space data set. This can mean that the first segment is a fully sampled segment and the combined segment is after the combination from the data lines from the different k-space data sets is also a fully sampled segment.

The second segment in the first and second k-space data set can be larger than the first segment in the first and second k-space data sets, and all segments of the first and second k-space data sets can comprise the same number of acquired k-space lines. As the second segment comprises a lower density of k-space lines, and as each of the spin echoes after a single excitation pulse are acquired in one of the segments, it is preferred to increase the second segment having a lower density in order to keep the echo train of the spin-echo fully used. All the segments are filled with the same number of echoes or lines, and as the k-space density is smaller in the outer segments (i.e. the second segments), such that the second segments are larger than the first segments.

It is possible to acquire only every nth k-space data line in the second segments of the first and second k-space data sets with n being an integer greater than or equal to two. In the same way, the size of the second segments can be increased by a factor n compared to the first segments where all k-space data lines are acquired.

The first segments of the first and second k-space data sets can each comprise the k-space center and the highest density of acquired k-space lines, wherein the first and second data sets each comprise a third segment located further away from the k-space center then the second segment. The further away from the k-space center a corresponding segment is located, the lower the k-space density of acquired k-space lines can be. A combined k-space data set can be generated additionally comprising a combined third segment, in which the k-space lines of the third segment of the first k-space data set are combined with the k-space data lines of the third segment of the second k-space data set. In this example, the data acquisition is further accelerated as the outermost segments, the third segments, have an even lower k-space density than the second segments. The combined third segment is generated using the k-space data lines from the other data sets to have a fully sampled third segment, the combined sword segment, which can be used to generate the MR image.

To this end, a third k-space data set, or several k-space data sets in addition to the first and second data sets, may be acquired, wherein this third k-space data set uses a third echo time and third delay time after the preparation pulse, wherein this third k-space data set comprises at least the first, second, and the third segment. At least one of the third delay time and the third echo time is different from the echo times and delay times used for the first and second k-space data sets, and the third segments of all k-space data sets are acquired such that different k-space lines are required in each of the third segments. The combined k-space data set then comprises a combined sword segment comprising k-space lines from at least two different third segments from at least two different k-space data sets.

By way of example in the outermost segment, the third segment, may be acquired such that the number of acquired k-space lines is decreased by a factor n of four, wherein in the second segment the number of acquired k-space lines is decreased by a factor n of two compared to the fully sampled k-space. The echoes for n=4 can then be shared over k-spaces from four different delay times.

Preferably, the number of segments corresponds to the number of spin echoes acquired after a single excitation pulse.

Furthermore, it is possible that a plurality of k-space data sets are acquired with at least two different echo times and at least four different delay times. This means that, in total, at least eight k-space data sets are acquired, wherein these eight k-space data sets differ from one another by at least one of the delay time and echo time.

Furthermore, the corresponding MR imaging system is provided comprising a control unit configured to generate the MR image of the object, as discussed above.

Additionally, a computer program comprising program code is provided which, when executed by a control unit of the MR system, cause the MR system to perform a method as discussed above or as discussed in further detail below. In addition, a carrier (e.g. a non-transitory computer-readable media) comprising the program code is provided.

BRIEF DESCRIPTION OF THE DRAWINGS/FIGURES

The foregoing and additional features and effects of the application will become apparent from the following detailed description, when read in conjunction with the accompanying drawings in which like reference numerals refer to like elements.

DETAILED DESCRIPTION

Figure 1:
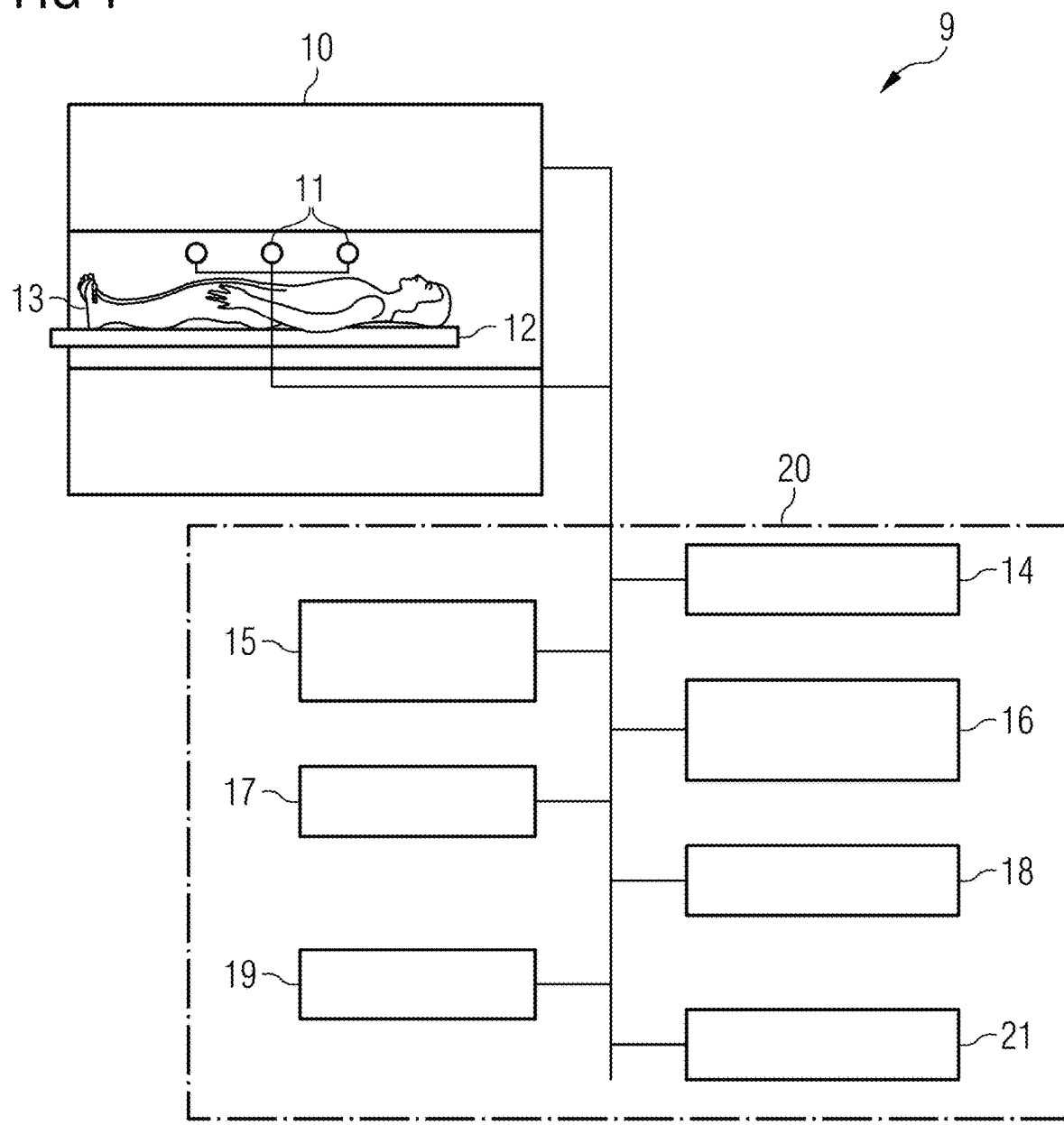
FIG. 1 shows a schematic view of an MR system with which MR images of a synthetic contrast can be generated with a decreased acquisition time, in accordance with an embodiment of the present disclosure.

In the following, embodiments of the disclosure will be described in detail with reference to the accompanying drawings. It is to be understood the following description of embodiments is not to be taken in a limiting sense. The scope of the disclosure is not intended to be limited by the embodiments described hereinafter or by the drawings, which are illustrative in nature.

The drawings are to be regarded as being schematic representations, and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may be implemented by any suitable direct or indirect connection or coupling. A coupling between components may be established over a wired or wireless connection. Functional blocks may be implemented in hardware, software, firmware, or a combination thereof.

FIG. 1 shows a schematic view of an MR system 9, which compromises a magnet 10 generating a polarization field BO. An object under examination 13 lying on a table 12 is moved into the center of the MR system 9 where MR signals after RF excitation can be detected by receiving coils 11 that can comprise different coil sections, wherein each coil section is associated with a corresponding detection channel By applying RF pulses and magnetic field gradients, the nuclear spins in the object 13, especially in the part located in the receiving coil 2, are exited and location coded, and the currents induced by the relaxation can be detected. The manner in which MR images are generated and how the MR signals are detected using a sequence of RF pulses and the sequence of magnetic field gradients are known in the art so that a detailed explanation thereof is omitted.

The MR system comprises a control unit 20 (e.g., an MR system controller), which is used for controlling the MR system. The control unit 20 comprises a gradient control unit 14 for controlling and switching the magnetic field gradients, and an RF control unit 15 for controlling and generating the RF pulses for the imaging sequences. An image sequence control unit 16 is provided, which controls the sequence of the applied RF pulses and magnetic field gradients and thus controls the gradient control unit 14 and the RF control unit 15. In a memory 17, computer programs needed for operating the MR system and the imaging sequences necessary for generating the MR images can be stored together with the generated MR images. The generated MR images can be displayed on a display 18, wherein an input unit 19 is provided for a user of the MR system to control the functioning of the MR system. A processing unit 21 can coordinate the operation of the different functional units shown in FIG. 1 and can comprise one or more processors which can carry out instructions stored on the memory 17. The memory includes the program code to be executed by the processing unit 21. The processing unit 21 can, based on the detected images, reconstruct an MR image As will be explained below the MR system of FIG. 1, the control unit 20 and processing unit 21 can be configured to acquire MR images based on fast spin echo imaging sequences in which different echo times and different delay times are used after a preparation pulse, e.g. an inversion pulse. The total acquisition time can be reduced by using an echo sharing principle in the outer k space segments of k space data sets using different delay or echo times.

Figure 2:
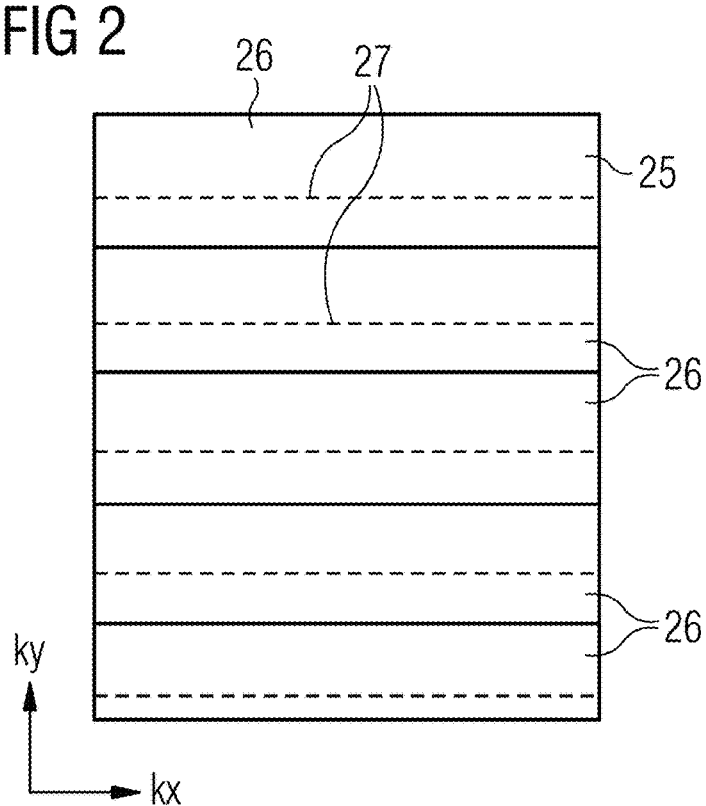
FIG. 2 shows a schematic view of a k-space divided into five segments that are each filled with one echo of an echo train containing five spin echoes as known in the art.

In FIG. 2, a k-space is schematically shown acquired with a multi spin echo imaging sequence, wherein in the k-space 25 comprises, in the example embodiment shown, five different segments 26. This k-space is acquired with a fast spin-echo sequence with an echo train of five spin echoes, wherein one line 27 is acquired in each of the segments, as schematically shown. As indicated, the readout direction kx is located in the horizontal direction in FIG. 2, wherein the phase encoding direction ky is indicated in the vertical direction.

Figure 3:
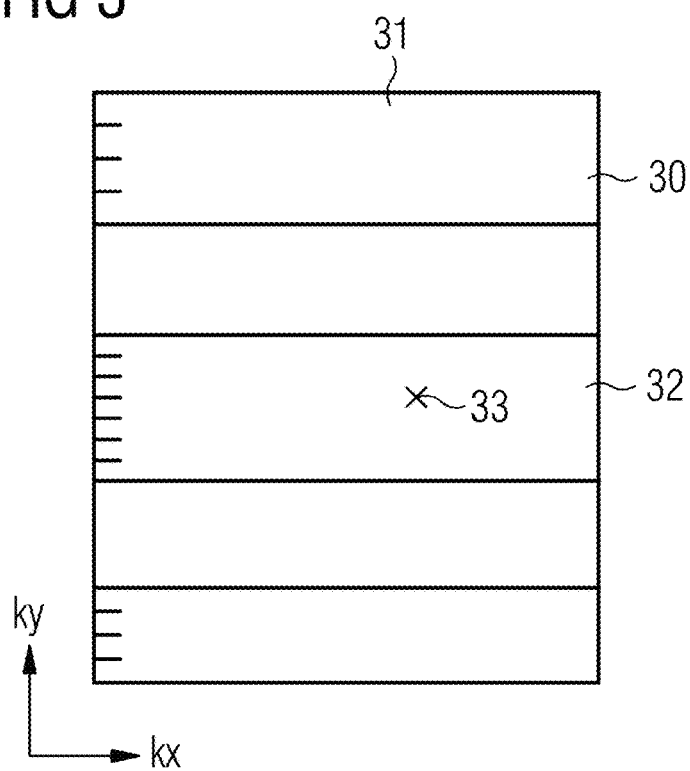
FIG. 3 shows a schematic view of a k-space in which the outermost segments are only filled with half the echo lines, in accordance with an embodiment of the present disclosure.

In FIG. 3, a k-space 30 is shown in which not all segments are completely filled. As shown by the reduced number of lines, segment 31 is only filled with half of the lines compared to segment 32 covering the center of k-space 33.

Figure 4:
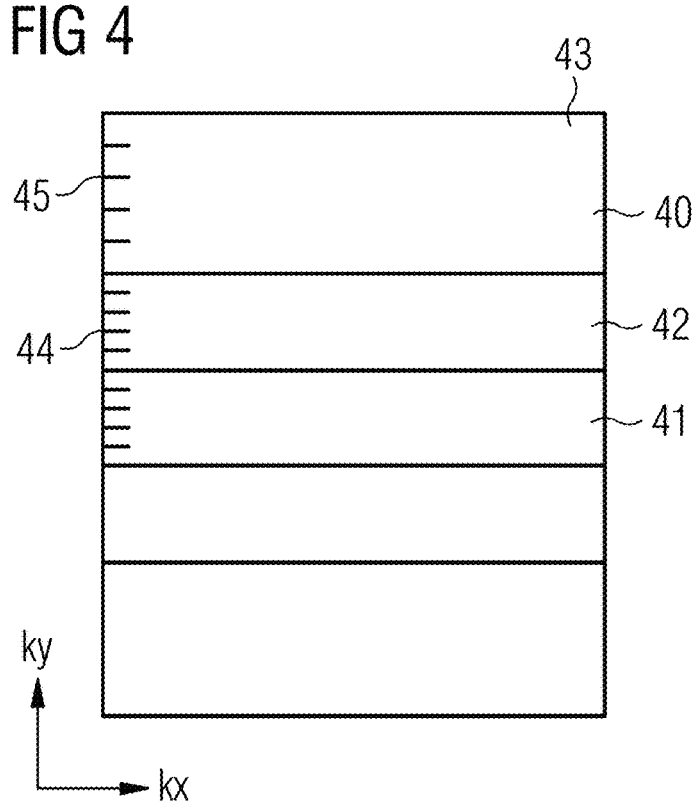
FIG. 4 shows a schematic view of the k-space in which the segment size is adapted so that all echo trains are a fully used, in accordance with an embodiment of the present disclosure.

As shown in FIG. 4, the segment size of the outer segments, which is only filled with half of the k-space lines, can be adapted so that all echoes of an echo train of a fast spin-echo sequence are fully used, meaning that in each segment one line is acquired. As the k-space density in the outer segments is reduced, the size of the outer segment has to be increased to have the same number of echo lines in each segment. As shown in FIG. 4, segments 41 and 42 of fully sampled with four k-space lines are shown in the example embodiment. It should be understood that the number of lines per segment is not limited to this example and can be much larger, by way of example a number between 30 and 50 lines, between 30 and 40 lines, etc. However, for the sake of clarity only a few lines are shown. Accordingly, the lines 44 in segments 41 and 42 symbolize the fully sampled segments, wherein the lines 45 have a double spacing so that only every second line is acquired as schematically shown by lines 45 in the outermost segment 43.

Figure 5:
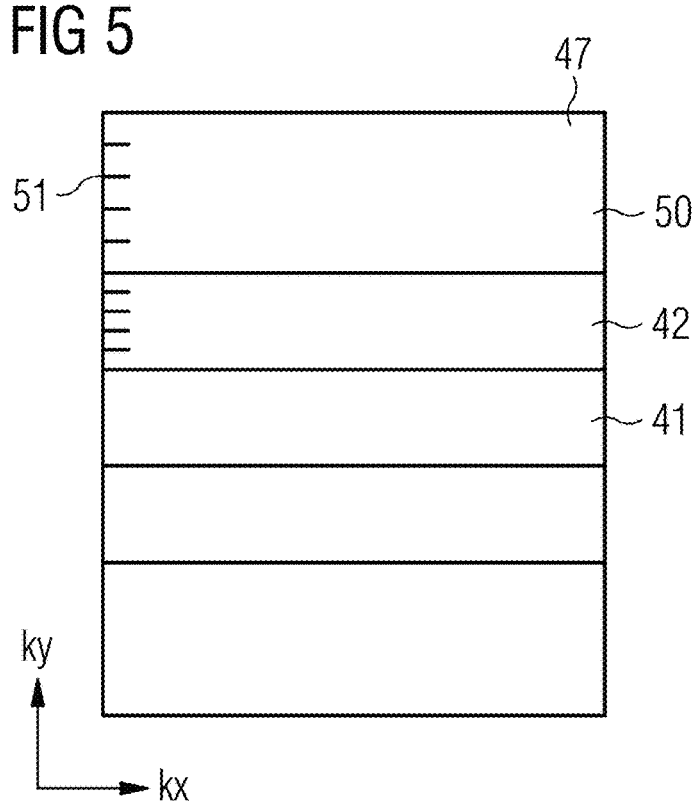
FIG. 5 shows a schematic view of the k-space of FIG. 4 in which the outer segment is acquired with another delay time so that other lines not acquired in the k space of FIG. 4 are acquired, in accordance with an embodiment of the present disclosure.

In FIG. 5, the k-space 50 is acquired a second time with another delay time, and the inner segments 41 and 42 are again fully sampled, wherein the outer segment 47 is sampled with half the density, but wherein the lines 51 are acquired such that the other lines of acquired in FIG. 4 are not required in this segment 47 of FIG. 5. Lines 45 and 51 of the two segments again provide a fully sampled segment.

Accordingly, to reduce the imaging time the outer segments are not acquired completely. The outer segments are only filled with every nth line, and the value n can also be defined as skipping value. In order to keep the echo trains fully used, the size of the outer segments is increased by the factor n, the skipping value, compared to the inner segments 42 and 41. As indicated, all segments are filled with the same number of echoes or k-space lines. In the example shown, this means that 20 lines are not acquired in the outer segments when 40 lines are acquired in the inner segments 41 and 42. 20 echo lines are acquired in segment 43, and another 20 echo lines are acquired with another delay or echo time in segment 47.

Figure 6:
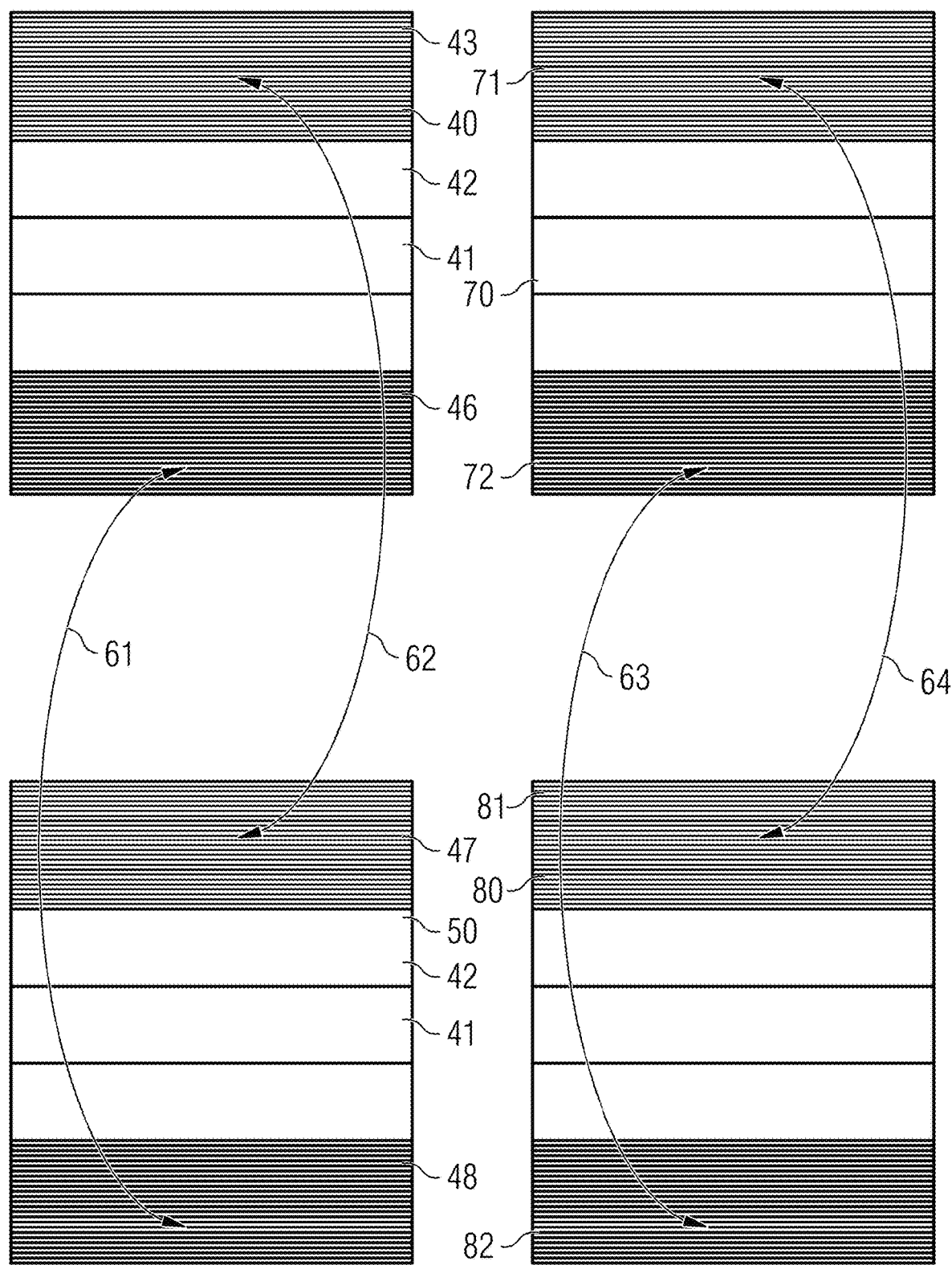
FIG. 6 shows a schematic view how the outer segments which we are not completely filled with k-space lines are filled with lines from other k-space data sets having other echo or delay times, in accordance with an embodiment of the present disclosure.

As shown in FIG. 6, a sharing approach is now used between the different delay times and the data acquisition pattern for the other segments is shifted for the other k-space. In the example of FIG. 4 for the first delay time the lines 0, 2, 4, 6, . . . are acquired. Four different k space data sets are shown acquired at four different delay times, the data sets 40, 50, 70 and 80. In each data set, the outer segments are not fully sampled. This means that for the second delay time shown in FIG. 5, the lines 1, 3, 5, 7 . . . are acquired in segment 47. Returning again to FIG. 6, missing data lines in the k-space of the first delay time are now copied from the k-space of the second delay time as shown by the arrows in FIG. 6.

In the embodiment shown, four different delay times were used and, as shown by arrows 61, the echo lines from segment 46 are used in segment 48, and vice versa, so that at the end a completely filled and combined k-space data set is provided, as a combined outer segment is generated. In the same way, the data lines of the third k-space data set 80 and the fourth k-space data set 70 are exchanged in the outer segments. In the embodiment shown, the lines are exchanged between data sets of a neighboring delay lines, but it is also possible that signal lines from the first and fourth delay time are exchanged, etc.

K-space data set 80 is acquired at a third delay time and k-space status at 70 is acquired at the fourth delay time. The k-space data lines from the third delay time in segment 81 are used to fill the non-acquired k-space data lines in segment 71 at the fourth delay time. In the same way the k-space data lines in segment 82 are used to fill the non-acquired k-space data lines in segment 72 at the fourth delay time, and vice versa.

Figure 7:
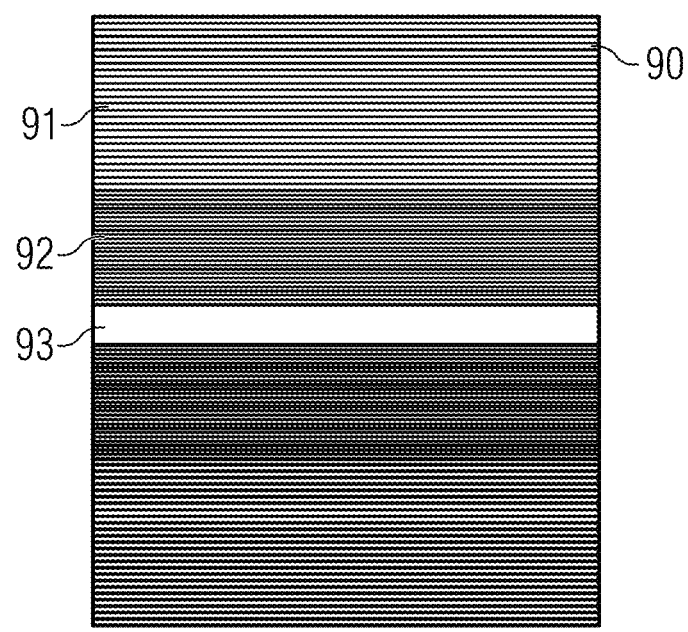
FIG. 7 shows a schematic view of a k-space in which different acceleration factors are used for the different segments, in accordance with an embodiment of the present disclosure.

FIG. 7 shows a further embodiment in which a higher acceleration is used for the segments located further away from the center. Accordingly, k-space 90 comprises a fully sampled k-space center segment 93, wherein in segment 92 every second line is acquired. In the outermost segment 91, only every fourth line is acquired. As can be seen, the size of segment 92 is double the size of segment 93, and the size of segment 91 is double the size of segment 92.

Figure 8:
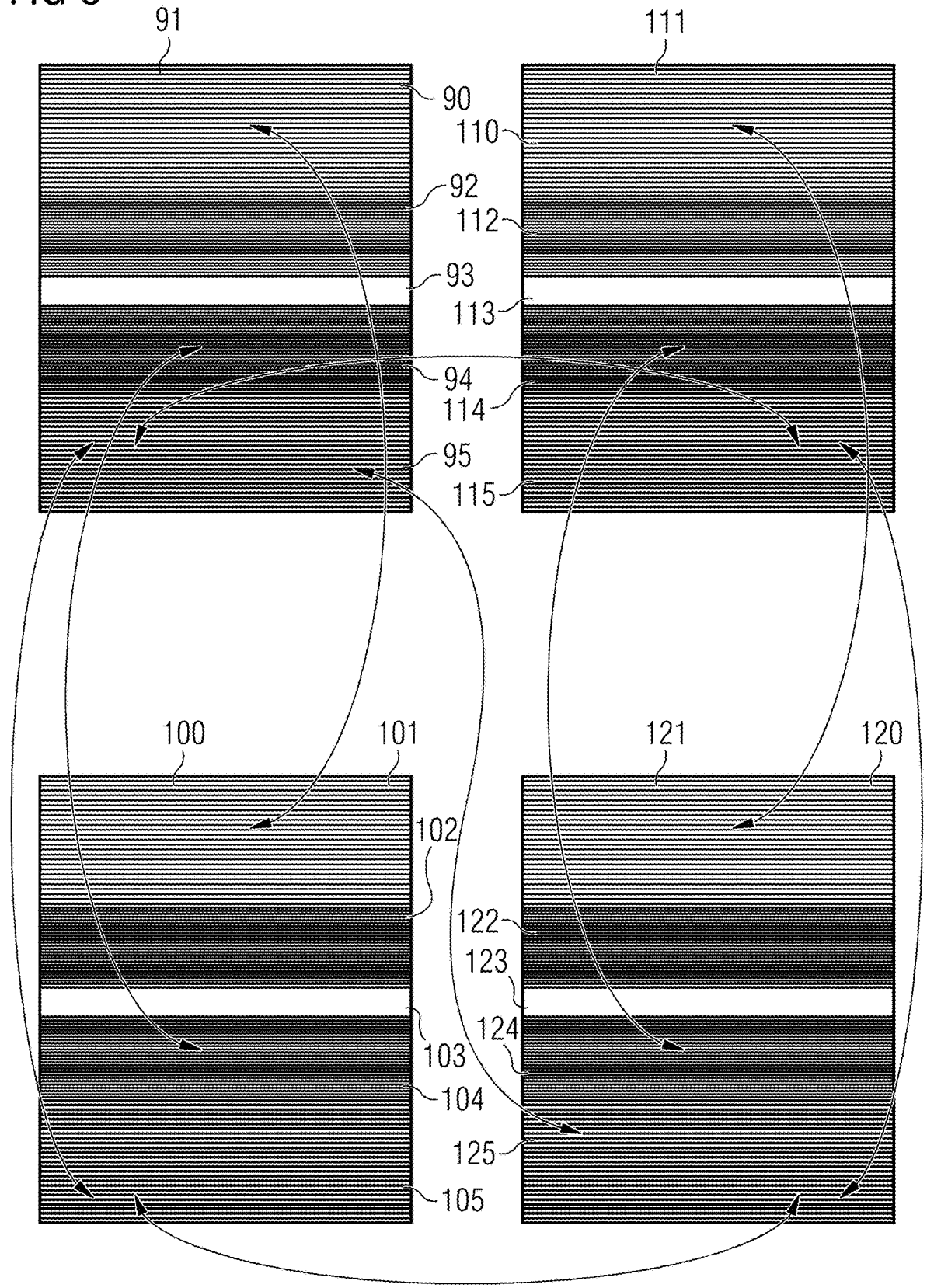
FIG. 8 shows a schematic view how the k-space of FIG. 7, especially the outer segments, are filled with k-space lines from other acquisitions having different delay times, in accordance with an embodiment of the present disclosure.

As shown in FIG. 8, in such a situation of FIG. 7, the k-space is acquired four times with different delay times so that k-space data sets 90, 100, 110, and 120 are obtained. These four k space data sets were acquired with four different delay times, a first delay time for data set 100, a second delay time for data set 90, a third delay time for data set 120, and a fourth delay time for data set 110. As segment 92 comprises only half the required data lines, the data lines from one other second segment (such as segment 102), are used to complete this corresponding segment. In the same way, data lines are exchanged between segment 104 and 94. In segments 91 and 95, only every fourth line is acquired. Accordingly, it is required to use the k-space data lines from the other three acquisitions. This means that in segment 95 the k-space data lines from segment 105, 115, and 125 can be used.

In other words, lines from segment 95, 115, 105 and 125 are all sharing the lines. In the same way the other segments 111, 115 are filled with k-space lines from the outermost segments from data sets 90, 100, and 120. The same is done for data set 100 and 120, so that in total four completely combined k-space data sets are provided, which can be used to generate MR images.

As shown in FIGS. 7 and 8, for a further data acquisition acceleration the approach can be extended to more segments with higher skipping values. The outermost segments can use the highest skipping value (e.g. four), whereas the next inner segments use a smaller skipping value (e.g. two) than the outermost segments, wherein the inner segments are fully sampled. The signal lines of four data sets are then shared over k space from all four delay times in order to generate 4 combined k space data sets, from which 4 different images can be reconstructed as known in the art.

Figure 9:
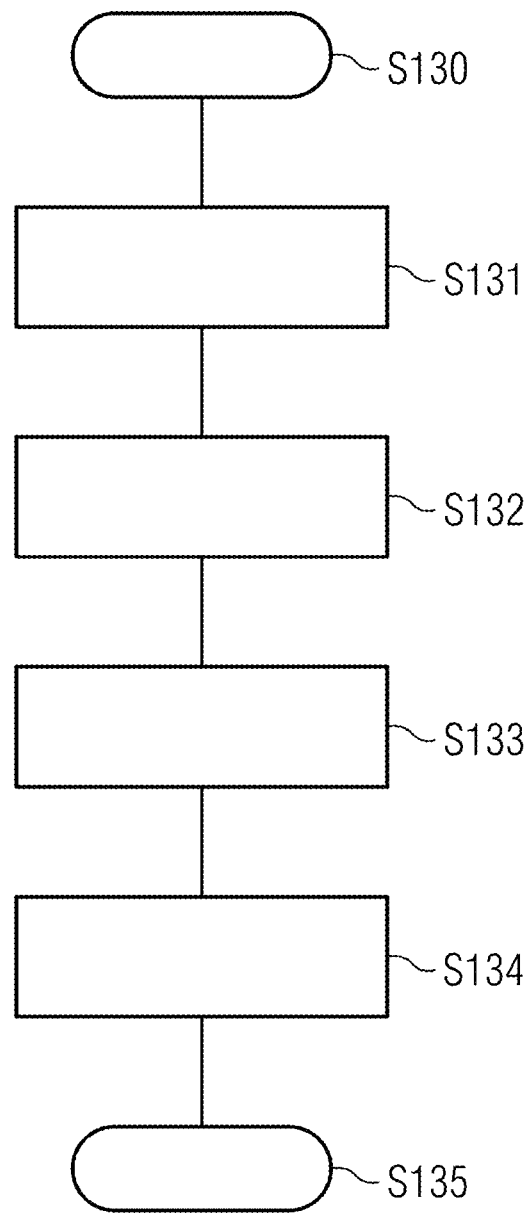
FIG. 9 shows a schematic view of a flowchart comprising the steps which are carried out by the MR system in order to acquire an MR image with a reduced acquisition time and a synthetic image contrast, in accordance with an embodiment of the present disclosure.

FIG. 9 summarizes the steps which may be carried out to generate an MR image with a synthetic image contrast in a reduced acquisition time.

The method starts in step S130, and in step S131 first k-space data set is acquired with the first delay time and the first echo time. As shown in the Figures, above the first k-space data set comprises a segment located in the k-space center which is a fully sampled data segment wherein the density of the outer segments is smaller. In step S132, the k-space is sampled another time with either another echo time or another delay time after the preparation pulse, which can be an inversion pulse. As in step S131, the outer segment is not fully sampled, but the lines not sampled in step S131 are sampled in the second data set. In step S133, a combined k-space data set is then generated comprising the combined segments of the outer part of the k-space in which the data lines from the different k-space data sets acquired in step S131 and in step S132 are combined. When the combined k-space data set is generated, it is possible in step S134 to generate the MR image based on the combined k-space data set. In the example given above, only two different data sets are acquired. However, as mentioned above in connection with FIGS. 3 to 8, a plurality of any suitable number of different k-space data sets can be acquired, e.g. 4 different delay times may be used and at least 2 different echo times.

The method ends in step S135. Summarizing the above discussed idea uses an echo-sharing approach between the different delay times in order to reduce the image acquisition time needed to generated synthetic contrast images.

The above-mentioned embodiments are preferred embodiments of the present disclosure provided by way of example, and should not be interpreted as restricting the present disclosure to these specific examples. Without departing the spirit and principle of the present disclosure, modifications, equivalent replacements, and improvements all fall within the scope of protection of the present disclosure.

What is claimed is:

1. A method for generating a magnetic resonance (MR) image of an object using a multi spin-echo based imaging sequence in which, after one excitation RF pulse, several spin-echoes are acquired in a plurality of k space segments, and a preparation pulse is used before acquiring the several spin-echoes, the method comprising:
acquiring a first k-space dataset of the object using a first echo time and a first delay time after the preparation pulse and before the several spin-echoes are acquired, the first k space dataset comprising a first segment that is located closer to a k space center than a second segment, with a density of acquired k space data lines being smaller in the second segment than in the first segment;
acquiring a second k space dataset of the object using a second echo time and a second delay time after the preparation pulse, the at least one of the second echo time and the second delay time being different than the corresponding first echo time and the first delay time, the second k space dataset comprising a first segment that is located closer to a k space center than a second segment, with a density of acquired k space data lines being smaller in the second segment than in the first segment, and the acquired k space data lines in the second segment of the second k space dataset being different than the acquired k space data lines of the second segment of the first k space data set;
generating a combined k space dataset comprising a combined second segment in which k space data lines of the second segment of first k space dataset and k space data lines of the second segment of the second k space dataset are combined; and
generating an MR image based on the combined k space dataset.

2. The method according to claim 1, wherein the combined k space dataset comprises at least the first segment from the first or second k space dataset and the combined second segment.

3. The method according to claim 1, wherein a density of the combined k space dataset is homogenous and constant over the combined k space dataset.

4. The method according to claim 1, wherein the second segment in the first and second k space datasets is larger than the first segment in the first and second k space datasets, and each of the segments of the first and second k space datasets comprise the same number of acquired k space lines.

5. The method according to claim 4, wherein in the second segments of the first and second k space datasets every nth k space data line is acquired,
wherein is an integer greater than or equal to 2, and
wherein a size of the second segments of the first and second k space datasets are increased by a factor n compared to the first segment where all k space data lines are acquired.

6. The method according to claim 1, wherein:
the first segments of the first and second k space datasets each comprise the k space center and the highest density of acquired k space lines,
the first and second datasets each comprise a third segment located further away from the k space center than the second segment,
the further away from the k space center a corresponding segment is located, the lower the k space density of acquired k space lines, and
a combined k space dataset is generated additionally comprising a combined third segment in which the k space data lines of the third segment of the first k space dataset are combined with the k space data lines the third segment from the second k space dataset.

7. The method according to claim 6, wherein:
a third k space dataset is acquired using a third echo time and a third delay after the preparation pulse, the third k space dataset comprising at least the first, second, and third segment,
at least one of the third echo time and the third delay time is different than the echo times and the delay times used for the first and second k space dataset, the third segments of each of the k space data sets are acquired such that different k space lines are acquired in each of the third segments, and the combined k space dataset comprises a combined third segment comprising k space lines from at least two different third segments from at least two different k space datasets.

8. The method according to claim 1, wherein a number of segments corresponds to a number of spin-echoes acquired after a single excitation pulse.

9. The method according to claim 1, wherein k space datasets with at least two different echo times and at least four different delay times are acquired.

10. A magnetic resonance (MR) imaging system, comprising:
an MR system controller configured to:
generate an MR image of an object and to apply a multi spin-echo based imaging sequence in which, after one excitation RF pulse, several spin-echoes are acquired in a plurality of k space segments, and a preparation pulse is used before acquiring the several spin-echoes;
acquire a first k-space dataset of the object using a first echo time and a first delay after the preparation pulse and before the several spin-echoes are acquired, the first k space dataset comprising a first segment that is located closer to a k space center than a second segment, with a density of acquired k space data lines being smaller in the second segment than in the first segment,
acquire a second k space dataset of the object using a second echo time and a second delay after the preparation pulse, the at least one of the second echo time and the second delay time being different than the corresponding first echo time and the first delay time, the second k space dataset comprising a first segment that is located closer to a k space center than a second segment, with a density of acquired k space data lines being smaller in the second segment than in the first segment, and the acquired k space data lines in the second segment of the second k space dataset being different than the acquired k space data lines of the second segment of the first k space data set; and
generate a combined k space dataset comprising a combined second segment in which k space data lines of the second segment of first k space dataset and k space data lines of the second segment of the second k space dataset are combined; and one or more processors configured to generate an MR image based on the combined k space dataset.

11. A non-transitory computer-readable medium associated with a magnetic resonance imaging system having instructions stored thereon that, when executed by one or more processors of the magnetic resonance imaging system, cause the magnetic resonance imaging system to:
generate an MR image of an object and to apply a multi spin-echo based imaging sequence in which, after one excitation RF pulse, several spin-echoes are acquired in a plurality of k space segments, and a preparation pulse is used before acquiring the several spin-echoes;
acquire a first k-space dataset of the object using a first echo time and a first delay after the preparation pulse and before the several spin-echoes are acquired, the first k space dataset comprising a first segment that is located closer to a k space center than a second segment, with a density of acquired k space data lines being smaller in the second segment than in the first segment,
acquire a second k space dataset of the object using a second echo time and a second delay after the preparation pulse, the at least one of the second echo time and the second delay time being different than the corresponding first echo time and the first delay time, the second k space dataset comprising a first segment that is located closer to a k space center than a second segment, with a density of acquired k space data lines being smaller in the second segment than in the first segment, and the acquired k space data lines in the second segment of the second k space dataset being different than the acquired k space data lines of the second segment of the first k space data set; and
generate a combined k space dataset comprising a combined second segment in which k space data lines of the second segment of first k space dataset and k space data lines of the second segment of the second k space dataset are combined; and
generate an MR image based on the combined k space dataset.

* * * * *